US010125264B2

(12) United States Patent
Ganapathiappan et al.

(10) Patent No.: US 10,125,264 B2
(45) Date of Patent: Nov. 13, 2018

(54) COMPOSITIONS FOR THREE-DIMENSIONAL (3D) PRINTING

(71) Applicant: Hewlett-Packard Development Company, L.P., Fort Collins, CO (US)

(72) Inventors: Sivapackia Ganapathiappan, Los Altos, CA (US); Hou T. Ng, Campbell, CA (US); Krzysztof Nauka, Palo Alto, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 48 days.

(21) Appl. No.: 14/786,536

(22) PCT Filed: Jun. 19, 2013

(86) PCT No.: PCT/US2013/046521
§ 371 (c)(1),
(2) Date: Oct. 22, 2015

(87) PCT Pub. No.: WO2014/204450
PCT Pub. Date: Dec. 24, 2014

(65) Prior Publication Data
US 2016/0083589 A1    Mar. 24, 2016

(51) Int. Cl.
| *C09D 4/00* | (2006.01) |
| *B33Y 70/00* | (2015.01) |
| *C08L 101/02* | (2006.01) |
| *G03F 7/027* | (2006.01) |
| *G03F 7/033* | (2006.01) |
| *G03F 7/038* | (2006.01) |
| *G03F 7/075* | (2006.01) |
| *C08L 75/16* | (2006.01) |

(52) U.S. Cl.
CPC ............... *C09D 4/00* (2013.01); *B33Y 70/00* (2014.12); *C08L 101/02* (2013.01); *G03F 7/027* (2013.01); *G03F 7/033* (2013.01); *G03F 7/038* (2013.01); *G03F 7/0757* (2013.01); *C08L 75/16* (2013.01)

(58) Field of Classification Search
CPC ..... C09D 11/30; C09D 11/101; C08L 101/02; B33Y 70/00; G03F 7/033; G03F 7/038; G03F 7/027
USPC .......................................... 522/99, 172, 148
See application file for complete search history.

(56) References Cited

U.S. PATENT DOCUMENTS

| 5,437,964 | A | * | 8/1995 | Lapin | C08G 59/18 430/269 |
| 6,127,085 | A | * | 10/2000 | Yamamura | G03F 7/0037 430/171 |
| 6,200,737 | B1 | * | 3/2001 | Walt | G02B 6/06 422/82.06 |
| 6,476,122 | B1 | * | 11/2002 | Leyden | B29C 41/003 264/401 |
| 7,211,368 | B2 | * | 5/2007 | Coats | B29C 41/003 430/284.1 |
| 7,381,360 | B2 | | 6/2008 | Oriakhi et al. | |
| 7,578,958 | B2 | | 8/2009 | Patel et al. | |
| 7,795,349 | B2 | | 9/2010 | Bredt et al. | |
| 8,106,107 | B2 | * | 1/2012 | Napadensky | B29C 67/0059 430/269 |
| 8,142,860 | B2 | * | 3/2012 | Vanmaele | B29C 67/0055 427/514 |
| 8,182,882 | B2 | * | 5/2012 | Johnson | G03F 7/032 427/487 |
| 2003/0207959 | A1 | * | 11/2003 | Napadensky | B29C 67/0059 522/183 |
| 2004/0187714 | A1 | * | 9/2004 | Napadensky | B29C 41/48 101/35 |
| 2009/0224438 | A1 | * | 9/2009 | Stampfl | B29C 33/3842 264/496 |
| 2010/0104852 | A1 | * | 4/2010 | Fletcher | B82Y 10/00 428/315.5 |
| 2010/0119835 | A1 | | 5/2010 | Messe et al. | |
| 2010/0140850 | A1 | * | 6/2010 | Napadensky | B29C 67/0059 264/401 |
| 2010/0272966 | A1 | | 10/2010 | Gould | |
| 2011/0077321 | A1 | * | 3/2011 | Napadensky | B29C 67/0059 522/182 |

(Continued)

FOREIGN PATENT DOCUMENTS

DE    102005050185    4/2007

OTHER PUBLICATIONS

Nakamura et al. (2011), Effects of compatibility between tackifier and polymer on adhesion property and phase structure: Tackifier-added polystyrene-based triblock/diblock copolymer blend system. J. Appl. Polym. Sci., 120: 2251-2260.*
Yuang Hong Corp. Product List for Triacrylate monomers. [online]. [Retrieved on May 26, 2017]. Retrieved from Interner:<URLhttp://www.yuanghong.com.tw/zh_CN/prodDetail.asp?id=83>.*
Yuang Hong Corp. Product List for Aliphatic Urethane Acrylates. [online]. [Retrieved on May 26, 2017]. Retrieved from Interner:<URLhttp://www.yuanghong.com.tw/zh_CN/prodDetail.asp?id=83>.*

(Continued)

*Primary Examiner* — Sanza L. McClendon
(74) *Attorney, Agent, or Firm* — Dierker & Kavanaugh PC

(57) ABSTRACT

A composition for three-dimensional printing includes a precursor to a soft polymer block having a glass transition temperature ($T_g$) less than 50° C. and a precursor to a rigid polymer block having a $T_g$ of at least 50° C. The precursor to the soft polymer block is a curable, cross-linkable monomer having an acrylic group, a vinyl group, or combinations thereof. The precursor to the rigid polymer block is a second curable, cross-linkable monomer selected from the group consisting of an acrylate monomer, a vinyl monomer, an acrylamide monomer, a urethane monomer, and an epoxy monomer.

10 Claims, 1 Drawing Sheet

(56) References Cited

U.S. PATENT DOCUMENTS

| | | | | |
|---|---|---|---|---|
| 2011/0262711 A1* | 10/2011 | Chopra | ............... | C09D 11/101 |
| | | | | 428/172 |
| 2012/0129972 A1 | 5/2012 | Hall et al. | | |
| 2012/0178845 A1* | 7/2012 | Napadensky | ....... | B29C 67/0059 |
| | | | | 522/96 |
| 2014/0131908 A1* | 5/2014 | Sun | ........................ | A61K 6/083 |
| | | | | 264/16 |

OTHER PUBLICATIONS

Glockner, Patrick. Radiation Curing: Coatings and Printing Inks; Technical Basics, Applications, and Trouble Shooting. (2008) Chapter 3, Sections 3.3 to 3.3.1.4. pp. 46-53.*

RadTech. The Association for UV & EB Technology: High-Performance Materials for Laminating Adhesives. from Sartomer. (2014) [online]. [Retrieved online on May 26, 2017]. Retrieved from <URL://http://radtech.org/2014proceedings/papers/technical-conference/Adhesives/Jin%20Lu%20-%20High%20Performance%20Materials%20for%20Laminating%20Adhesives.pdf>.*

Tsang, Valerie Liu, et al., "Fabrication of Three-Dimensional Tissues", Adv. Biochem Engin/ Biotechnol (2006) 103: 189-205.

* cited by examiner

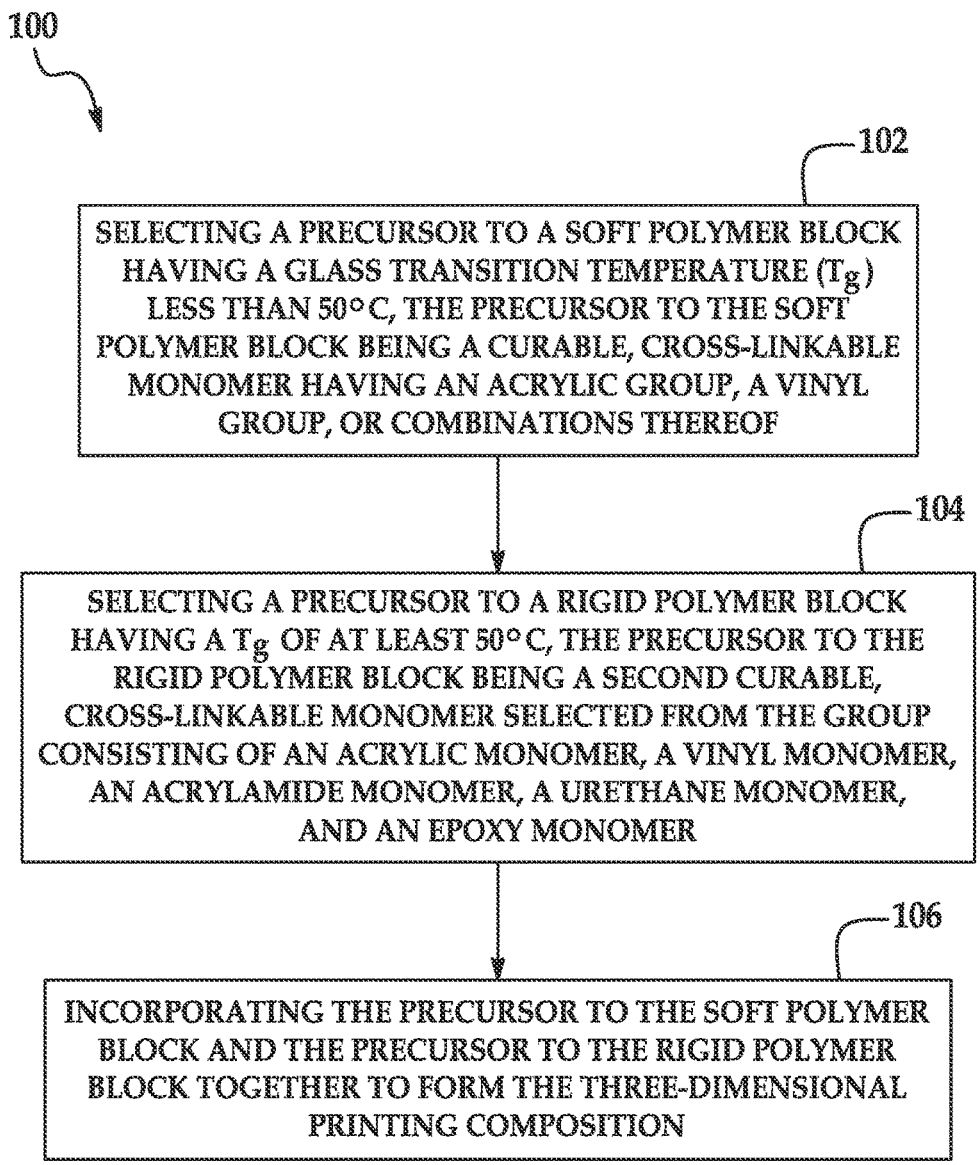

COMPOSITIONS FOR THREE-DIMENSIONAL (3D) PRINTING

BACKGROUND

Three-dimensional (3D) printing is an additive printing process used to make three-dimensional solid objects from a digital model. 3D printing is often used in rapid product prototyping, mold generation, and mold master generation. 3D printing techniques are considered additive processes because they involve the application of successive layers of material. This is unlike traditional machining processes, which often rely upon the removal of material to create the final object. Materials used in 3D printing often require curing or fusing, which for some materials may be accomplished using heat-assisted extrusion or sintering, and for other materials may be accomplished using digital light projection technology.

BRIEF DESCRIPTION OF THE DRAWING

Features and advantages of examples of the present disclosure will become apparent by reference to the following detailed description and the drawing.

FIG. 1 is a flow diagram illustrating an example of a method of making an example of a three-dimensional printing composition.

DETAILED DESCRIPTION

Examples of the 3D printing compositions disclosed herein are used to generate 3D objects/products that exhibit both desirable mechanical properties (e.g., tensile modulus and strength, elongation performance, heat deflection, dimensional stability, and/or impact strength) and a desirable surface finish (i.e., a surface RMS roughness less than 5 µm). This is advantageous over traditional thermoset materials, which often have a desirable surface finish and tensile strength, but exhibit poor elongation, impact strength, and/or dimensional accuracy. This is also advantageous over traditional thermoplastic materials (such as acrylonitrile butadiene styrene (ABS) resins), which often exhibit reasonable mechanical properties, but have a poor surface finish due to heat-assisted extrusion or sintering processes that are used for curing/fusing. It is believed that the ability to achieve the desired mechanical and surface finish properties in the examples disclosed herein is due, at least in part, to the composition disclosed herein. In particular, the composition includes a rigid polymer precursor(s) and a soft polymer precursor(s). When included in suitable proportions and exposed to light, these precursors are able to form an intertwined block copolymer network that possesses rigid polymer building blocks distributed among soft polymer building blocks. These building blocks are distinct polymers that each contribute to the properties of the copolymer and to the resulting 3D object or product. It is believed that these building blocks afford mechanical properties comparable to traditional thermoplastic materials and surface finish properties comparable to traditional thermoset materials.

The composition may be a liquid or a paste. The composition includes the soft polymer precursor and the rigid polymer precursor mixed together (with or without other additives). The liquid has a viscosity of 50 cps or less, and the paste is a thick, relatively soft, moist substance that has a viscosity greater than 50 cps. In an example, the paste viscosity ranges from 50 cps to about 10,000 cps. The composition (whether a liquid or a paste) may be deposited using a variety of techniques, including, as examples, inkjet printing, materials printing, and spreading of the material. When inkjet or materials printers are used, it is to be understood that the nozzle(s) used for deposition may be selected so that they are capable of depositing the composition having a particular viscosity. Inkjet or materials printing may be desirable, for example, when generating prototypes or samples. Use of a spreading mechanism (such as a doctor blade or a roller) may increase the efficiency of the printing process, at least in part because one entire layer may be applied during a single sweep of the spreading mechanism.

As used herein, the terms "soft polymer precursor" and "precursor to a soft polymer block" refer to a curable, cross-linkable monomer that polymerizes to form a polymer having a glass transition temperature ($T_g$) that is less than 50° C. The soft polymer precursor is polymerizable with free-radical initiators. In some examples, this curable, cross-linkable monomer includes an acrylic group (i.e., which includes a vinyl group and a carboxylic acid terminus), a vinyl group, or combinations of acrylic and vinyl groups. Examples of the soft polymer precursor include a siloxane monomer including the acrylic group, a poly(dimethylsiloxane) having the acrylic group as a terminal group (e.g., poly(dimethylsiloxane), vinyl terminated, molecular weight 25,000, available from Aldrich), a poly(dimethylsiloxane) having the vinyl group as a terminal group, stearyl methacrylate, 1-octene, 2-octene, 3-octene, 1-octadecene, polybutadiene, polybutadiene-block-polyisoprene, or combinations thereof. In an example, PATTERN RESIN™ (an acrylic resin from GC America Inc., Alsip, Ill.) may be used as the soft polymer precursor. In some examples, another suitable soft polymer precursor is a stamp resin (e.g., a polymerizable silicone resin). It is to be understood however, that stamp resin has a lower plasticity than PATTERN RESIN™, and thus a higher amount may be used in order to achieve the desirable mechanical characteristics of the resulting 3D object.

It is believed that the soft polymer block formed from the polymerization of the soft polymer precursor imparts some flexibility to the 3D object that is formed, which enables the 3D object to exhibit desirable elongation performance. As such, the elongation performance may be affected by the degree of flexibility of the soft polymer precursor. The soft polymer precursor's degree of flexibility may be controlled, at least in part, by adjusting the weight average molecular weight of the soft polymer precursor. For example, if the molecular weight of the soft polymer precursor is too low (less than 200), the cross-linking density will become higher, leading to a more rigid polymer block. In an example, the precursor to the soft polymer block has a weight average molecular weight ranging from about 200 to about 500,000.

Also as used herein, the terms "rigid polymer precursor" and "precursor to a rigid polymer block" refer to a curable, cross-linkable monomer that polymerizes to form a polymer having a glass transition temperature ($T_g$) that is at least 50° C. (i.e., 50° C. or higher). The rigid polymer precursor is polymerizable with free-radical initiators. This curable, cross-linkable monomer may be an acrylate monomer, a vinyl monomer, an acrylamide monomer, a urethane monomer, or an epoxy monomer. Suitable acrylate monomers for the rigid polymer precursor include triethylene glycol dimethacrylate (TEG DMA), triethylene glycol diacrylate, di(ethylene glycol)dimethacrylate, tetraethylene glycol diacrylate, ethylene glycol dimethacrylate, propylene glycol dimethacrylate, butane glycol dimethacrylate, glycerol dimethacrylate, pentaerythritol tri(meth)acrylate, pentaerythritol tetra (meth)acrylate, bisphenol A dimethacrylate, and/or 1,4-phenylene dimethacrylate. An example of the acrylamide monomer is N,N'-methylenebis(acrylamide). Suitable vinyl monomers for the rigid polymer precursor include di(ethylene glycol)divinyl ether and/or divinylbenzene. Examples of the urethane monomer include aliphatic urethane acrylates of the CN9000 series from Sartomer, Exton, Pa. Other suitable urethane acrylates from Sartomer include CN972, CN978, CN992, CN1963, CN1964, and CN999. An example of the epoxy monomer is bisphenol A glycerate dimethacrylate. Some commercially available epoxy acrylate monomers include CN1119, CN120Z, CN121, CN153, CN154, and CN2602, all of which are available from Sartomer.

Referring now to FIG. 1, an example of a method 100 for making the 3D printing composition disclosed herein is depicted. As illustrated in reference numerals 102 and 104, the method 100 involves selecting the two precursors, one of which is the precursor to the soft polymer block, and the other of which is the precursor to the rigid polymer block. As discussed above, the respective precursors are selected so that upon polymerization and cross-linking a copolymer is formed having soft polymer blocks that have a $T_g$ of less than 50° C. and rigid polymer blocks that have a $T_g$ equal to or greater than 50° C.

The method 100 also includes incorporating the soft polymer precursor and the rigid polymer precursor together, as shown at reference numeral 106. Prior to incorporating the precursors together, a suitable amount of each of the precursors is determined.

In an example, the amount of each of the precursors is selected so that a ratio of the soft polymer precursor to the rigid polymer precursor ranges from 3:1 to 1:3. The amount of the respective precursors may vary depending, at least in part, on the desired mechanical properties for the 3D object/product to be formed with the composition. For example, desirable tensile modulus and strength as well as elongation performance may be achieved when using a soft precursor to rigid precursor ratio of 1:1. If tensile strength and elongation performance are more desirable properties than tensile modulus, then it may be desirable to adjust the ratio of soft precursor to rigid precursor to about 1:2. However, if elongation performance is a more desirable property than either tensile modulus or strength, then it may be desirable to adjust the ratio of soft precursor to rigid precursor to about 2:1. As such, in the examples disclosed herein, the ratio of soft polymer precursor to rigid polymer precursor may be adjusted so that the composition, when cured, forms a solid material having the desired mechanical properties. Furthermore, when soft polymer precursors are used that have a lower plasticity than PATTERN RESIN™, the ratio of soft polymer precursor to rigid polymer precursor should be higher than 1:1 and lower than 1:0.

In an example, the composition includes at least 25 wt. % of the rigid polymer precursor, based upon the total wt. % of the composition. Therefore, in some examples, the amount of the rigid polymer precursor ranges from about 25 wt. % to about 75 wt. % of the total wt. % of the composition, and the amount of the soft polymer precursor makes up a balance of the composition (taking into account that other additives may or may not be added) and thus ranges from about 75 wt. % to about 25 wt. % of the total wt. % of the composition. In some examples, the composition includes about 50 wt. % of each of the soft and rigid polymer precursors, or about 33 wt. % of the soft polymer precursor and about 67 wt. % of the rigid polymer precursor, or about 33 wt. % of the rigid polymer precursor and about 67 wt. % of the soft polymer precursor. Other weight percentages of the respective polymer precursors may also be used in order to achieve desirable mechanical properties.

After selecting the amounts, the two precursors are mixed together. Mixing may be accomplished with standard mixing or milling equipment. In an example, mixing is accomplished for a predetermined number of cycles, with a predetermined time for cooling between cycles. In an example, the soft polymer precursor dissolves or disperses in the rigid polymer precursor upon mixing. A constant or varying speed may be used to mix the two precursors together, and mixing may be performed until the composition is substantially homogeneous (as observed by the human eye). A substantially uniform mixture will enable the soft and rigid polymer blocks that are generated during polymerization to distribute uniformly throughout the integrated network that is formed.

In an example, as the two precursors are incorporated together, one or more additives may be added. In another example, after the two precursors are incorporated together, one or more additives may be added. Examples of suitable additives include a light sensitive initiator, a catalyst, a pigment, or combinations thereof. Other additives, such as gellants and/or waxes, are generally not included in the composition. Additionally, the composition also excludes solid particles (e.g., micronized particles), which can cause lateral light scattering, leading to the formation of rough edges and/or poor surface roughness in the resulting 3D object.

The light sensitive initiator is included in the composition as an additive, unless the soft polymer precursor that is selected is already mixed with an initiator. The "light sensitive" additive is a component that is activated upon exposure to light. As an example, a light sensitive initiator is a chemical compound that absorbs the light to which it is exposed. The absorbed energy is transferred from the chemical compound to monomer(s) present in the composition to generate radicals. The generated radicals react with other monomer(s) to induce polymerization and cross-linking, and to generate a polymer. If catalyst(s) (discussed below) are also present, the radical formation is readily activated. As mentioned, the light sensitive initiator is used to promote a polymerization reaction. The light sensitive initiator used depends, at least in part, on the wavelength(s) suitable for curing/fusing the soft and rigid precursors that are used. In an example, the light sensitive initiator may be sensitive to (i.e., absorbs) light having a wavelength ranging from about 300 nm to about 1100 nm. In another example, the light sensitive initiator is sensitive to light having a wavelength ranging from about 300 nm to about 600 nm, or from about 600 nm to about 1100 nm.

Examples of suitable light sensitive initiators include GENOCURE® CQ (i.e., a camphor quinone available from Rahn USA Corp., Aurora, Ill.) and initiators available from Spectra Group Ltd., Inc., Millbury, Ohio, such as H-Nu 470 (i.e., 5,7-diiodo-3-butoxy-6-fluorone), H-Nu 470X (i.e., a powder blend), H-Nu 470IL (i.e., a liquid blend containing N,N-dimethylacrylamide), H-Nu 470LT (i.e., a liquid blend), H-Nu 535 (i.e., 2,4,5,7-Tetraiodo-3-hydroxy-6-fluorone), and H-Nu 635 (i.e., 2,4,5,7-Tetraiodo-3-hydroxy-9-cyano-6-fluorone). Combinations of various initiators may also be used.

The total amount of the light sensitive initiator that is added depends, at least in part, on the total amount of polymer precursors that is used. In an example, the light sensitive initiator is included in an amount ranging from about 0.1 wt. % to about 5 wt. % of the total wt. % of the soft and rigid polymer precursors. In another example, the light sensitive initiator is included in an amount ranging from about 0.5 wt. % to about 2 wt. % of the total wt. % of the soft and rigid polymer precursors.

Some examples of the composition also include a catalyst that speeds up the rate of polymerization. Examples of suitable catalysts include alkyl amines or diphenyliodonium salts, which increase the cure rate of the composition. Other examples of suitable catalysts include GENOMER® 5161 (i.e., an acrylated amine synergist available from Rahn USA Corp.) or GENOCURE® EHA (i.e., an aminobenzoate synergist available from Rahn USA Corp.). The total amount of each catalyst that is added depends, at least in part, on the total amount of polymer precursors that is used. In an example, the catalyst may be present in an amount ranging from about 0.05 wt. % to about 10 wt. % of the total wt. % of the soft and rigid polymer precursors. In another example, the catalyst may be present in an amount ranging from about 0.1 wt. % to about 3 wt. % of the wt. % of the total wt. % of the soft and rigid polymer precursors.

Some other examples of the composition also include a pigment, which imparts color to the composition. The pigment may be a self-dispersing pigment or the soft polymer precursor may act as a suitable dispersant for dispersing the pigment throughout the composition. It is believed that any standard color pigments may be used, such as phthalocyanines for blue, quinacridone for magenta or red, pigment yellow for yellow, etc. In an example, the pigment may be present in an amount ranging from about 0.05 wt. % to about 10 wt. % of the wt. % of the composition. In another example, the pigment may be present in an amount ranging from about 0.1 wt. % to about 3 wt. % of the wt. % of the composition.

When used in a 3D printing process, the composition may be applied as a thin film on a surface (i.e., a substrate, a mold, etc.) using, as mentioned above, a materials printer or a spreading mechanism (such as a doctor blade or a roller). The thin film may have a thickness ranging from about 1 µm to about 500 µm.

Once the desired thin film is applied, all or portion(s) of the thin film is/are exposed to light of a suitable wavelength for a fixed duration. The light exposure causes the composition to cure, polymerize, cross-link, etc. The wavelength(s) of the light used will depend upon the photoinitiator that is used. In an example, the light has a wavelength ranging from about 300 nm to about 1100 nm. The timing for light exposure may range anywhere from 1 µs to 5 min, depending upon the thickness of the thin film and/or the illumination intensity. As an example, a 100 µm thick film may be exposed to light for about 1 µs when a light source having a high illumination intensity is used. Any illumination intensity above 50 mW/cm² may be considered high illumination intensity. The time may be expanded as desired in order to ensure complete curing. Exposing the thin film to light forms a solidified layer of a 3D product/object that has a desirable shape.

The solidified layer includes the intertwined block copolymer network. This network is made up of a plurality of soft polymer blocks having the low $T_g$ and a plurality of rigid polymer building blocks (having the higher $T_g$) distributed among soft polymer building blocks. The distribution of the soft and rigid polymer blocks depends upon the amount of each of the precursors that is utilized.

A second thin film of the composition may be applied to all or portion(s) of the solidified layer, and the light exposure process may be repeated to form a second solidified layer of the 3D product. The process may be repeated until the desired 3D product is formed. It is to be understood that additional thin film application and polymerization results in an increase in the thickness of all or portion(s) of the original solidified layer.

The composition(s) disclosed herein enables the 3D products to be formed relatively quickly due, at least in part, to the rapid reaction kinetics of the composition. For example, a 10"×10"×10" part may be fabricated in fewer than 4 hours. This is a significant improvement over 8 hours to 10 hours that may be needed for product fabrication using traditional thermoplastic or thermoset materials and/or heat assisted curing.

After the 3D product is formed, any uncured composition may be removed by wiping or washing with water and a surfactant or soap, or a suitable organic liquid (e.g., isopropanol) that will not deleteriously affect the surface of the 3D product.

After washing, the 3D product may be exposed to a heating process. This heating process may assist in settling the solidified layer(s) to form more compact layer(s). Performing an additional heating process after any uncured composition is removed may also cause additional cross-linking to occur in the layer(s) that remain. In an example, heating may be accomplished at a temperature that is slightly higher (e.g., within 10 degrees) than the $T_g$ of the soft polymer block (i.e., the lower $T_g$ block of the two blocks). In an example, heating may be accomplished in a single step process for a predetermined time ranging from about 5 minutes to about 60 minutes. In another example, a dual step temperature profile may be used. For example, a first heating step may be performed at a temperature that is slightly higher than the $T_g$ of the low $T_g$ (i.e., soft) polymer block, followed by a second heating step performed at a temperature that is slightly higher than the $T_g$ of the higher $T_g$ (i.e., rigid) polymer block.

It is believed that the 3D object/product formed from the composition disclosed herein may exhibit similar mechanical properties to those of traditional ABS resins. For example, the 3D final object/product made via the composition(s) disclosed herein may exhibit a tensile modulus greater than 2 GPa, a tensile strength greater than 5 MPa, and/or elongation at break of greater than 20%.

To further illustrate the present disclosure, an example is given herein. It is to be understood that this example is provided for illustrative purposes and is not to be construed as limiting the scope of the present disclosure.

EXAMPLE

One comparative paste (comparative sample 1) and three sample pastes (samples 1, 2 and 3) were prepared using PATTERN RESIN™ (an acrylic resin from GC America Inc., Alsip, Ill., which had about 1.5 wt. % of GENOCURE® CQ and GENOCURE® EHA mixed therein). Samples 1, 2, and 3 included the PATTERN RESIN™ as the soft polymer precursor and included triethylene glycol dimethacrylate (TEG DMA) as the rigid polymer precursor. Comparative sample 1 did not include any rigid polymer precursor.

For comparative sample 1, PATTERN RESIN™ was spread on a glass plate and was exposed to UV light for 5 minutes to obtain a film.

For sample 1, 3 g of PATTERN RESIN™ and 3 g of TEG DMA were mixed together. For sample 2, 1.578 g of PATTERN RESIN™ and 3.155 g of TEG DMA were mixed together. For sample 3, 7.03 g of PATTERN RESIN™ and 3.515 g of TEG DMA were mixed together. For each of these samples, a homogeneous solution was obtained by mixing the components in a SpeedMixer for 30 seconds at 20,000 RPM. The solutions were spread on respective glass plates and were exposed to UV light for 5 minutes to obtain films.

Two additional comparative pastes were prepared using a stamp resin (e.g., a polymerizable silicone resin). In this Example, the stamp resin pastes are considered comparative examples because of the amounts used. In comparative sample 2, the stamp resin alone was used, and in comparative sample 3, the stamp resin was used in combination with triethylene glycol dimethacrylate as the rigid polymer precursor at a ratio of 1:1.

For testing mechanical properties, the sample and comparative sample films were tested using a dedicated tensile tester or a TA DMA (Dynamic Mechanical Analysis) equipped with a tension clamp. Properties including tensile modulus, tensile strength at break, and elongation at break were measured. Table 1 shows the results.

TABLE 1

| Sample | Soft Polymer Precursor Type | wt. % | Rigid Polymer Precursor Type | wt. % | Tensile modulus (MPa) | Tensile strength at break (MPa) | Elongation at break (%) |
|---|---|---|---|---|---|---|---|
| Comparative Sample 1 | PATTERN RESIN ™ | 100 | None | | 118 | 5.03 | 6.9 |
| Sample 1 | PATTERN RESIN ™ | 50 | TEG DMA | 50 | 2580 | 5.11 | 23.2 |
| Sample 2 | PATTERN RESIN ™ | 33 | TEG DMA | 67 | 196 | 6.37 | 33.3 |
| Sample 3 | PATTERN RESIN ™ | 67 | TEG DMA | 33 | 228 | 2.57 | 49 |
| Comparative Sample 2 | Stamp Resin | 100 | None | | 0.86 | 0.5 | 84 |
| Comparative Sample 3 | Stamp Resin | 50 | TEG DMA | 50 | 182 | 3.2 | 1.9 |

As illustrated in Table 1, varying the sample composition changes the respective mechanical properties. To mimic the mechanical properties of ABS, it may be desirable that the cured paste exhibit a tensile modulus greater than 2 GPa (i.e., 2000 MPa), a tensile strength greater than 5 MPa, and elongation at break of greater than 20%. In this Example, Sample 1 (including a 50/50 blend of the soft polymer precursor and rigid polymer precursor disclosed herein) achieved these results. Samples 2 and 3 show enhanced performance in tensile modulus and elongation compared to comparative sample 1. The results for samples 1 through 3 represent a significant combined improvement in performance over many current photopolymers used in various 3D printing techniques.

Furthermore, some applications favor elongation at the expense of tensile strength or tensile modulus. As illustrated in Table 1, samples 1 through 3 exhibit significantly improved elongation performance over comparative sample 1.

As illustrated in the results for comparative samples 2 and 3, lower plasticity soft polymer precursors, such as stamp resin, exhibit relatively undesirable combined mechanical properties (i.e., tensile modulus, tensile strength, and elongation). For the examples of the composition disclosed herein, it is believed that the amount of the rigid polymer precursor (when used with a low plasticity soft polymer precursor) should be lowered from the amount used in comparative sample 3 in order to obtain more desirable combined mechanical properties.

It is to be understood that the ranges provided herein include the stated range and any value or sub-range within the stated range. For example, a range from about 25 wt. % to about 75 wt. % should be interpreted to include not only the explicitly recited limits of about 25 wt. % to about 75 wt. %, but also to include individual values, such as 27 wt. %, 45 wt. %, 62 wt. %, etc., and sub-ranges, such as from about 30 wt. % to about 65 wt. %, from about 50 wt. % to about 70 wt. %, etc. Furthermore, when "about" is utilized to describe a value, this is meant to encompass minor variations (up to +/−10%) from the stated value.

Reference throughout the specification to "one example", "another example", "an example", and so forth, means that a particular element (e.g., feature, structure, and/or characteristic) described in connection with the example is included in at least one example described herein, and may or may not be present in other examples. In addition, it is to be understood that the described elements for any example may be combined in any suitable manner in the various examples unless the context clearly dictates otherwise.

In describing and claiming the examples disclosed herein, the singular forms "a", "an", and "the" include plural referents unless the context clearly dictates otherwise.

While several examples have been described in detail, it will be apparent to those skilled in the art that the disclosed examples may be modified. Therefore, the foregoing description is to be considered non-limiting.

What is claimed is:

1. A composition for three-dimensional printing, the composition comprising:
   a precursor to a soft polymer block, the soft polymer block having a glass transition temperature ($T_g$) less than 50° C., the precursor to the soft polymer block being a curable, cross-linkable monomer having a vinyl group, and the precursor to the soft polymer block being selected from the group consisting of 1-octene, 2-octene, 3-octene, 1-octadecene, and combinations thereof; and
   a precursor to a rigid polymer block, the rigid polymer block having a $T_g$ of at least 50° C., the precursor to the rigid polymer block being a second curable, cross-linkable monomer selected from the group consisting of an acrylate monomer, a vinyl monomer, a urethane monomer, an acrylamide monomer, and an epoxy monomer;
   wherein the precursor to the rigid polymer block is present in an amount of at least 25 wt. % of a total wt. % of the composition;

and wherein the precursor to the soft polymer block is present in an amount of at least 25 wt. % of a total wt. % of the composition.

2. The composition as defined in claim 1, further comprising a light sensitive initiator.

3. The composition as defined in claim 1, further comprising an additive selected from the group consisting of a catalyst, a pigment, and combinations thereof.

4. A composition for three-dimensional printing, the composition consisting of:
a precursor to a soft polymer block, the soft polymer block having a glass transition temperature ($T_g$) less than 50° C., the precursor to the soft polymer block being a curable, cross-linkable monomer having an acrylic group, a vinyl group, or combinations thereof, and the precursor to the soft polymer block being selected from the group consisting of a siloxane monomer including the acrylic group, stearyl methacrylate, 1-octene, 2-octene, 3-octene, 1-octadecene, and combinations thereof; and
a precursor to a rigid polymer block, the rigid polymer block having a $T_g$ of at least 50° C., the precursor to the rigid polymer block being a second curable, cross-linkable monomer selected from the group consisting of an acrylate monomer, a vinyl monomer, a urethane monomer, an acrylamide monomer, and an epoxy monomer;
wherein:
an initiator is present in a mixture with the precursor to the soft polymer block, and the mixture is present in an amount ranging from about 25 wt. % to about 75 wt. % of a total wt. % of the composition; and
the precursor to the rigid polymer block is present in an amount of at least 25 wt. % of a total wt. % of the composition, and makes up a balance of the composition.

5. The composition as defined in claim 1 wherein the precursor to the rigid polymer block is the acrylate monomer and is selected from the group consisting of triethylene glycol dimethacrylate (TEG DMA), triethylene glycol diacrylate, di(ethylene glycol) dimethacrylate, tetraethylene glycol diacrylate, ethylene glycol dimethacrylate, propylene glycol dimethacrylate, butane glycol dimethacrylate, glycerol dimethacrylate, pentaerythritol tri(meth)acrylate, pentaerythritol tetra(meth)acrylate, bisphenol A dimethacrylate, and 1,4-phenylene dimethacryalate.

6. A composition for three-dimensional printing, the composition comprising:
a precursor to a soft polymer block, the soft polymer block having a glass transition temperature ($T_g$) less than 50° C., the precursor to the soft polymer block being a curable, cross-linkable monomer having an acrylic group, a vinyl group, or combinations thereof; and
a precursor to a rigid polymer block, the rigid polymer block having a $T_g$ of at least 50° C., the precursor to the rigid polymer block being a second curable, cross-linkable monomer selected from the group consisting of an acrylate monomer, a vinyl monomer, a urethane monomer, an acrylamide monomer, and an epoxy monomer;
wherein the precursor to the rigid polymer block is:
the acrylamide monomer and is N,N'-methylenebis(acrylamide); or
the vinyl monomer and is selected from the group consisting of di(ethylene glycol) divinyl ether and divinylbenzene;
and wherein the precursor to the rigid polymer block is present in an amount of at least 25 wt. % of a total wt. % of the composition.

7. A solidified layer of a three-dimensional product, the solidified layer comprising a block copolymer formed from the composition defined in claim 1, wherein the block copolymer consists of:
a plurality of the soft polymer blocks having the $T_g$ less than 50° C.; and
a plurality of the rigid polymer blocks distributed among the soft polymer blocks, the rigid polymer blocks having the $T_g$ of at least 50° C.

8. A method for making a three-dimensional printing composition, the method comprising:
selecting a precursor to a soft polymer block, the soft polymer block having a glass transition temperature ($T_g$) less than 50° C., the precursor to the soft polymer block being a curable, cross-linkable monomer having a vinyl group, and the precursor to the soft polymer block being selected from the group consisting of 1-octene, 2-octene, 3-octene, 1-octadecene, and combinations thereof;
selecting a precursor to a rigid polymer block, the rigid polymer block having a $T_g$ of at least 50° C., the precursor to the rigid polymer block being a second curable, cross-linkable monomer selected from the group consisting of an acrylate monomer, a vinyl monomer, an acrylamide monomer, a urethane monomer, and an epoxy monomer; and
incorporating the precursor to the soft polymer block and the precursor to the rigid polymer block together to form the three-dimensional printing composition;
wherein the precursor to the rigid polymer block is present in an amount of at least 25 wt. % of a total wt. % of the composition;
and wherein the precursor to the soft polymer block is present in an amount of at least 25 wt. % of a total wt. % of the composition.

9. The method as defined in claim 8 wherein the incorporating includes mixing from about 25 wt. % to about 75 wt. % of the precursor to the soft polymer block with a balance of the precursor to the rigid polymer block.

10. The method as defined in claim 8, further comprising adding a light sensitive initiator to the three-dimensional printing composition.

* * * * *

UNITED STATES PATENT AND TRADEMARK OFFICE
CERTIFICATE OF CORRECTION

PATENT NO. : 10,125,264 B2
APPLICATION NO. : 14/786536
DATED : November 13, 2018
INVENTOR(S) : Sivapackia Ganapathiappan et al.

It is certified that error appears in the above-identified patent and that said Letters Patent is hereby corrected as shown below:

In the Claims

In Column 9, Line 46, Claim 5, delete "dimethacryalate." and insert -- dimethacrylate. --, therefor.

Signed and Sealed this
Seventh Day of May, 2019

Andrei Iancu
*Director of the United States Patent and Trademark Office*